US00RE39603E

(19) United States
(12) Reissued Patent
Kata et al.

(10) Patent Number: US RE39,603 E
(45) Date of Reissued Patent: May 1, 2007

(54) PROCESS FOR MANUFACTURING SEMICONDUCTOR DEVICE AND SEMICONDUCTOR WAFER

(75) Inventors: Keiichiro Kata, Kanagawa (JP); Shinichi Chikaki, Kanagawa (JP)

(73) Assignee: NEC Corporation, Tokyo (JP)

(21) Appl. No.: 10/645,782

(22) Filed: Aug. 22, 2003

Related U.S. Patent Documents

Reissue of:
(64) Patent No.: 5,844,304
Issued: Dec. 1, 1998
Appl. No.: 08/533,207
Filed: Sep. 25, 1995

(30) Foreign Application Priority Data

Sep. 30, 1994 (JP) ..... 6-237653

(51) Int. Cl.
*H01L 23/544* (2006.01)

(52) U.S. Cl. ..... 257/620; 257/737; 257/738; 257/786

(58) Field of Classification Search ..... 257/620, 257/737, 738, 786, 762, 766, 773
See application file for complete search history.

(56) References Cited

U.S. PATENT DOCUMENTS

| | | | | |
|---|---|---|---|---|
| 3,719,981 A | * | 3/1973 | Steitz | 438/616 |
| 3,760,238 A | | 9/1973 | Hamer et al. | |
| 4,604,644 A | * | 8/1986 | Beckham et al. | 257/737 |

(Continued)

FOREIGN PATENT DOCUMENTS

| | | | |
|---|---|---|---|
| EP | 0485760 | * | 5/1992 |
| JP | 4952973 | * | 5/1974 |
| JP | 52-087983 | | 7/1977 |
| JP | 63-86458 | | 4/1988 |
| JP | 63-293965 | | 11/1988 |
| JP | 64-57643 | | 4/1989 |
| JP | 1-173733 | | 7/1989 |
| JP | 1-196856 | | 8/1989 |
| JP | 4-373131 | | 12/1992 |
| JP | 05-121413 | | 5/1993 |
| JP | 5129366 | * | 5/1993 |
| JP | 5-166812 | | 7/1993 |
| JP | 5-218042 | | 8/1993 |
| JP | 5-267302 | | 10/1993 |
| JP | 677293 | * | 3/1994 |
| JP | 6-112211 | | 4/1994 |

OTHER PUBLICATIONS

R. Chanchani et al., "A New mini Ball Grid Array (mBGA) Multichip Module Technology"; International Journal of Microcircuits & Electronic Packaging, 18(1995) Third Quarter, No. 3, Reston, VA, pp. 185–192., Dec. 1995.*

Ray–Long Day et al., "A Silicon–on–Silicon Multichip Module Technology with Integrated Bipolar Components in the Substrate", IEEE Multi–Chip Module Conference MCMC–94, Mar. 15–17, 1994, pp. 64–67.

*Primary Examiner*—Mark V. Prenty
(74) *Attorney, Agent, or Firm*—Foley & Lardner LLP

(57) ABSTRACT

A process for manufacturing a semiconductor device includes defining chip sections on a wafer by scribe lines with each chip section having chip electrodes formed thereon. The wafer is covered with a passivating film except for on the chip electrodes. Aluminum interconnection layers are provided such that each layer is connected to the chip electrode at one end thereof and the other end of the layer is extended towards the central portion of the chip section. A cover coating film is applied on the passivating film and the layers. A number of apertures are formed in the coating film passing therethrough, and bump electrodes are formed at the position corresponding to the apertures. The chip sections are then separated from each other along the scribe lines into semiconductor devices.

20 Claims, 4 Drawing Sheets

U.S. PATENT DOCUMENTS 4,878,098 A 10/1989 Saito et al.
4,907,062 A 3/1990 Fukushima
4,948,754 A 8/1990 Kondo et al.
5,027,188 A * 6/1991 Owada et al. ..... 257/758
5,049,980 A 9/1991 Saito et al.
5,111,278 A 5/1992 Eichelberger
5,137,845 A * 8/1992 Lochon et al. ..... 438/614
5,250,843 A * 10/1993 Eichelberger ..... 257/692
5,289,038 A 2/1994 Amano
5,327,013 A * 7/1994 Moore et al. ..... 257/772
5,434,452 A * 7/1995 Higgins, III ..... 257/773
5,554,940 A 9/1996 Hubacher
5,604,379 A * 2/1997 Mori ..... 257/738
5,844,304 A * 12/1998 Kata et al. ..... 257/620

* cited by examiner

PROCESS FOR MANUFACTURING SEMICONDUCTOR DEVICE AND SEMICONDUCTOR WAFER

Matter enclosed in heavy brackets [ ] appears in the original patent but forms no part of this reissue specification; matter printed in italics indicates the additions made by reissue.

BACKGROUND OF THE INVENTION

The present invention relates to a process for manufacturing a semiconductor device and, more particularly, to a process suited for mass production of a highly integrated semiconductor device.

Semiconductor devices of various forms have been developed to meet recent demands in the electronics field towards size and weight reduction, speed increase, and improvement of functional operations of the devices. The semiconductor device comprises a package and a semiconductor chip (hereinafter, also referred to as a chip) contained in the package. The chip has been integrated higher and higher, and such a highly integrated semiconductor chip increases the number of terminals thereon. In addition, there have been severe demands on the semiconductor chips towards the possible reduction in size. The terminal-to-terminal pitch should thus be reduced to meet these demands or requirements for the semiconductor devices. A semiconductor device having a high terminal count can be obtained by inner lead bonding or by area array bonding. The inner lead bonding and the area array bonding are expected to be inevitable for the field of the semiconductors.

The inner lead bonding (ILB) is used to make electrical contact between the chip and the leads within the package. Various bonding technologies are available to achieve this inner lead bonding. Wire bonding is the most extensively used electrical interconnection process. In this process, fine wires are used to make electrical contact between the bonding pads on the chip and the corresponding leads on the package. The wire diameter is typically from 20 to 30 micrometers. Wire bonding techniques include thermocompression bonding, ultrasonic bonding, and thermosonic bonding.

The use of the fine wires limits the number of interconnections available in one package. The recent demands for the semiconductor devices with a high terminal count thus causes a problem of poor connections between the wire and the bonding pads. Considering this fact, the wire bonding has been replaced with wireless bonding. The wireless bonding is also called gang bonding, with which all bumps on the electrode pads are bonded simultaneously to the leads. Wireless bonding techniques include tape automated bonding (TAB) and flip-chip bonding. The TAB is also referred to as tape carrier bonding.

In the TAB technique, a laminated tape of gold-plated copper foil etching in the form of leads is bonded to the bumps on the electrode pads. The elimination of the wire bonding is advantageous from viewpoints of size reduction and highly integrated packaging of the device. On the other hand, the flip-chip bonding requires to make a raised metallic bump of solder on the chip. The chip is then inverted and bonded face down to the substrate interconnection pattern. This process lends itself to production of semiconductor devices with a high terminal count and a smaller pitch. In addition, this technique is also advantageous to provide a fast, low-noise semiconductor device with the short length of the interconnections.

The TAB and flip-chip bonding techniques use the bumps provided between the chip and the package to make electrical interconnection between them. These techniques are disclosed in, for example, Japanese Patent Laid-open Nos. 5-129366 and 6-77293.

As mentioned above, the film carrier semiconductor device disclosed in these laid-open publications uses the bumps for the electrical interconnection between the chip and the carrier film. There is another film carrier semiconductor device in which the electrical interconnection between the chip and the carrier film is achieved without using the bumps. The semiconductor chip and the carrier film are electrically connected during the assembly process. The bumps are used only for the purpose of connecting the film carrier semiconductor device with, for example, a circuit board or a mounting board. The film carrier semiconductor device of the type described comprises a semiconductor chip and a carrier film. Contact pads are provided on the semiconductor chip at one side thereof. The contact pads are arranged along the periphery of the semiconductor chip. Interconnecting layers are provided on the carrier film. The carrier film is also provided with through-holes and openings formed therein. The openings are formed at the position corresponding to the contact pads (chip electrodes).

A conventional process for manufacturing a semiconductor device is described first for the purpose of facilitating the understanding of the present invention. In this event, description is made on a process for manufacturing a film carrier semiconductor device. A wafer, which comprises a number of chip sections each having chip electrodes formed thereon, is covered with a passivating film by using a well-known technique. After the formation of the passivating film, the chip electrodes are exposed to the atmosphere. The chip sections are then separated from each other into individual chips along scribe lines by means of a known dicing technique using a dicing saw. The semiconductor chip so obtained is prepared along with a carrier film and an adhesion film. The adhesion film is positioned relative to the semiconductor chip and placed thereon. The carrier film and the semiconductor chip are subjected to heat and pressure to adhere them through the adhesion film. The carrier film is then cut along the edges of the chip by means of any adequate method. Next, bump electrodes (solder bump) are formed on corresponding outer chip electrodes arranged on the carrier film.

Semiconductor devices so obtained may find various applications in the electronics, electrical, and other fields. For example, semiconductor devices may be used for memories and drivers for a liquid crystal display. Such applications are suited for mass-production of the semiconductor device. However, the above mentioned manufacturing process has a certain limitation on the number of chips obtained per unit time because the operation should be made for each chip. Recent demands for smaller memories or drivers have reduced the size of the semiconductor device itself. Accordingly, it is necessary to conduct the operations such as the inner lead bonding and the formation of the bumps for each small chip. Such operation is so elaborate and somewhat troublesome because the semiconductor chip is relatively small. It is thus difficult to position the carrier film positively or with a high accuracy. The elaborate operation is also associated with the reliability of the electrical interconnection between the semiconductor chip and the carrier film. In other words, there may be trouble in the interconnection between the semiconductor chip and the carrier film as well as the adhesion of the individual components. In this respect, a batch process may be more effective than the conventional process for the mass-production of the semiconductor device, in which most operations are conducted on chip sections of a wafer. In this process, the bump electrodes are formed on the chip sections of the wafer which are not separated from each other into the individual chips.

Such a method is disclosed in, for example, U.S. Pat. No. 5,137,845, issued to Lochon et al. This method has developed by IBM Corporation and is applicable to the manufacturing of bump electrodes for semiconductor chips that are suitable for Controlled Collapse Chip Connection (C4) or flip-chip technique. In this method, a barrier metal is deposited on aluminum chip electrodes, on which bump electrodes are deposited for a terminal contact. The resultant wafer is, however, directed to the application as it is. In other words, this patent is not for a wafer to be divided into semiconductor chips. There is no disclosure of the separation of the wafer nor the disclosure about the position of the interconnection, chip electrodes, and bump electrodes to avoid the breakage of them upon dicing. In addition, the bump electrodes in the above mentioned conventional semiconductor devices are formed on the corresponding chip electrodes. The formation of the bumps on the electrodes is, however, difficult or even impossible by the practical consideration to meet recent demands on the semiconductor chips towards the possible reduction in size with a higher terminal count and a smaller pitch.

This problem may be solved by means of using a multi-layered electrode structure of the semiconductor device which allows the distribution of the solder pads on the entire surface of the semiconductor chip. Such a structure is, however, complex and difficult to be manufactured. In addition, the multi-layered electrode significantly affects the configuration of the chip surface. A larger number of layers may sometimes make the surface irregular.

Accordingly, an object of the present invention is to provide a process for manufacturing a semiconductor device having bump electrodes formed at different positions from chip electrodes, which is suited for mass-production.

Another object of the present invention is to provide a process for manufacturing a semiconductor device having a good thermal stress resistance.

Yet another object of the present invention is to provide a process for manufacturing a semiconductor device having a good moisture resistance.

SUMMARY OF THE INVENTION

In order to achieve the above mentioned object, there is provided a process for manufacturing a semiconductor device comprising the steps of defining a number of semiconductor chip sections on a wafer, each semiconductor chip section having a number of chip electrodes formed on one surface along a periphery thereof, the one surface being covered with a passivating film except for the positions where the chip electrodes are formed; forming a number of interconnection layers on the wafer for each semiconductor chip section such that each interconnection layer is connected to the chip electrode at one end thereof and is extended inward the chip section at the other end; covering the entire surface of the wafer with a cover coating film; forming a number of apertures in the cover coating film, the apertures being formed into a matrix; forming a number of bumps on the apertures; and separating the semiconductor chip sections on the wafer as individual semiconductor chips along scribe lines.

In the above mentioned process, the intermediate layer extended inward the semiconductor chip section is preferably exposed to the atmosphere through the aperture. In addition, the solder bumps are preferably formed away from the scribe line. Furthermore, the bump electrodes are preferably formed at the position not just over the chip electrodes.

The above and other objects, features and advantages of the present invention will become more apparent in the following description and the accompanying drawing in which like reference numerals refer to like parts and components.

According to another aspect of the present invention, there is provided a semiconductor wafer having a number of semiconductor chips comprising bump electrodes formed into a matrix on an entire surface of the wafer except for on scribe lines between the semiconductor chips.

DESCRIPTION OF THE PREFERRED EMBODIMENT

Figure 1A:
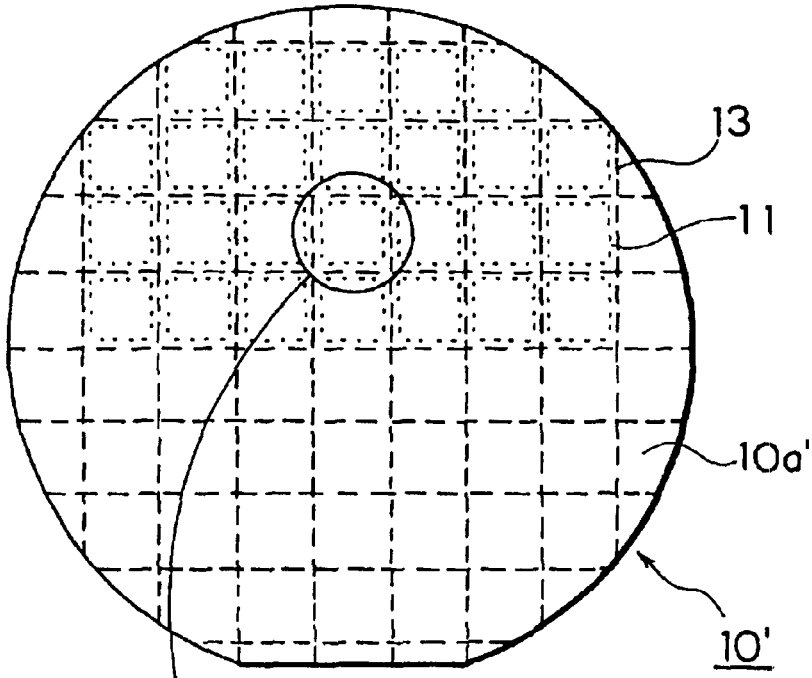
FIG. 1A PRIOR ART
FIG. 1A is a schematic plan view of a wafer having a number of chip sections subjected to a conventional process for manufacturing a semiconductor device.
Figure 1B:
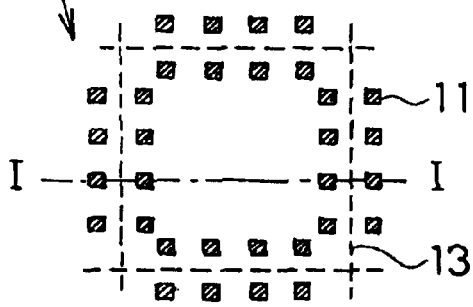
FIG. 1B PRIOR ART
FIG. 1B is an elongated view of a chip section in FIG. 1A.
Figure 1C:
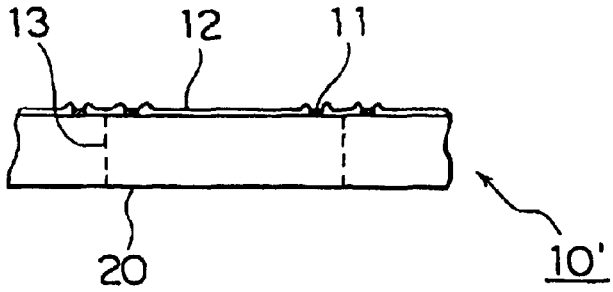
FIG. 1C PRIOR ART
FIG. 1C is a cross-sectional view of the chip section taken on line I—I in FIG. 1B.

A conventional process for manufacturing a semiconductor device is described first for the purpose of facilitating the understanding of the present invention. In this event, description is made on a process for manufacturing a film carrier semiconductor device. Referring to FIGS. 1A through 1C, a semiconductor bare chip is prepared by using, for example, a well-known wafer manufacturing technique. A wafer 10' comprises a number of chip sections 10a' each having chip electrodes (contact pads) 11 formed thereon. Though the illustrated chip electrodes 11 are formed along the periphery of each chip section 10a', the chip electrodes may be formed within an active area. The chip electrodes 11 are typically made of an aluminum-based alloy. The wafer 10' is then provided with a passivating film 12. More particularly, the entire surface of the wafer 10' is covered with the passivating film 12. The passivating film 12 may be made of, for example, polyimide, silicon nitride, or silicon oxide by using a well-known technique such as spin coating. The passivating film has a thickness of 20 micrometers or smaller. After the formation of the passivating film, the chip electrodes 11 are exposed to the atmosphere by means of exposing the wafer 10' to light and etching it. As a result, the passivating film 12 covers the entire surface of the wafer 10' except for the locations where the chip electrodes 11 are formed. The chip sections 10a' are then separated from each other into individual chips along scribe lines 13. The separation is made by means of a known dicing technique using a dicing saw.

Referring to FIG. 2, a process for manufacturing a conventional semiconductor device is described. A semiconductor chip 20 obtained in the manner described above is prepared along with an adhesion film 25 and a carrier film 30 (FIG. 2A). Ball bumps 14 of gold are formed on the chip electrodes 11. The adhesion film 25 is interposed between the semiconductor chip 20 and the carrier film 30. The adhesion film 25 is smaller than the semiconductor chip 20 and has a thickness of about several tens of micrometers.

The carrier film 30 comprises an organic insulation film 31. The organic insulation film 31 may be, for example, a polyimide-based insulation film. The organic insulation film 31 has a first surface 31a and a second surface 31b. Interconnection layers 32 are provided on the organic insulation film 31 on the side of the first surface 31a. Through-holes 33 are formed in the insulation film 31. One end of each through-hole 33 faces the interconnection layer 32. Each through-hole 33 passes through the insulation film 31 to the second surface 31b thereof. The insulation film 31 is also provided with openings 34 penetrating through the film. The openings 34 are formed at the position corresponding to the chip electrodes 11. Each through-hole 33 is filled with a conductive electrode 35. Likewise, each opening 34 is filled with a filler material 36.

Figure 2A:
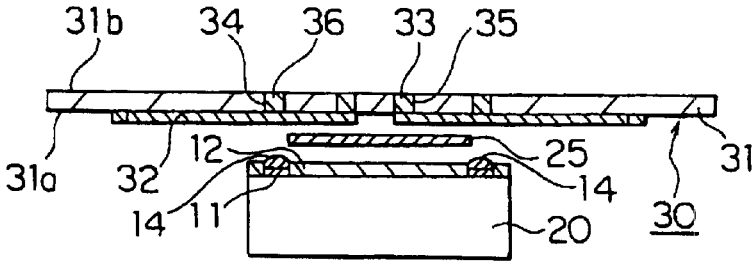
FIG. 2A PRIOR ART
FIGS. 2A through 2G are cross-sectional flow diagrams showing a process for manufacturing a conventional semiconductor device.
Figure 2B:
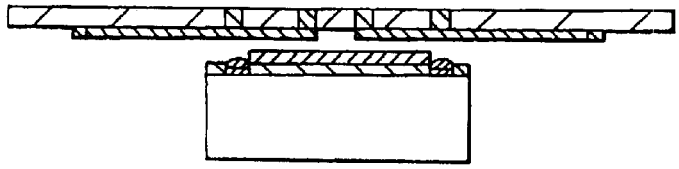
FIG. 2B PRIOR ART

Referring to FIG. 2B, the adhesion film 25 is positioned relative to the semiconductor chip 20 and placed thereon. When made of a thermoplastic resin, the adhesion film 25 can be temporarily fixed on the semiconductor chip 20 by means of heating it from the side of the chip up to a temperature at which the adhesion film 25 begins to melt. In this event, the adhesion film 25 is adhered to the semiconductor chip 20 in such a manner that no voids are trapped between the film 25 and the chip 20.

Figure 2C:
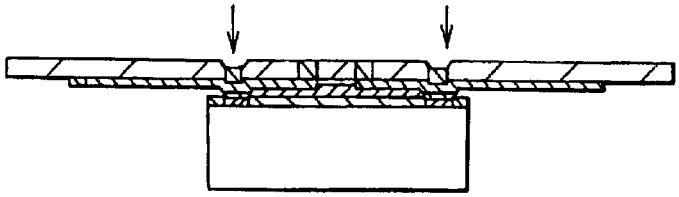
FIG. 2C PRIOR ART

Referring to FIG. 2C, the carrier film 30 is positioned relative to the semiconductor chip 20 with the adhesion film 25 thereon, and the interconnection layers 32 are connected to the chip electrodes 11 via the ball bumps 14 by means of the inner lead bonding technique. More specifically, the conductive electrode 35 contacts with one end of the interconnection layer 32. The other end of the inter-connection layer 32 reaches between the contact pad 11 and the opening 34. In this event, the aluminum forming the chip electrode 11 is reacted with copper forming the interconnection layer 32 and with the gold forming the ball bumps 14 into an aluminum-copper-gold alloy to ensure the interconnection between them.

Figure 2D:
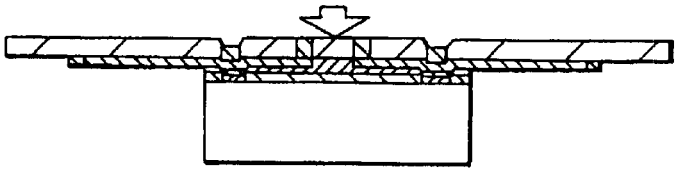
FIG. 2D PRIOR ART

Referring to FIG. 2D, the combination of the semiconductor chip 20 and the carrier film 30 is subjected to heat and pressure to adhere them through the adhesion film 25. The combination, which is referred hereinafter to as a chip assembly, is heated and pressurized for several seconds from the side of either the semiconductor chip 20 or the carrier film 30.

The above mentioned steps illustrated in FIGS. 2B through 2D are not the limitation on the method available for connecting the carrier film 30 and the semiconductor chip 20. The adhesion film 25 may be positioned and plated relative to the carrier film 30 rather than the semiconductor chip 20. Alternatively, the inner lead bonding may be made after the carrier film 30 is adhered to the semiconductor chip 20 with high accuracy with the adhesion film 25 interposed between them. An adhesion layer may be formed previously on the surface of the chip section of the wafer.

Figure 2E:
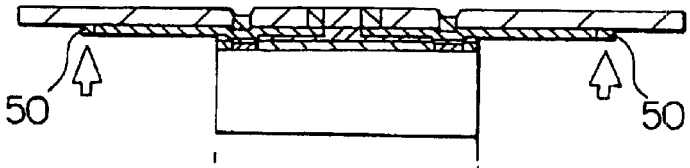
FIG. 2E PRIOR ART

In FIG. 2E, the chip assembly is subjected to an electrical sorting operation and tests on the long-term reliability under low electric field bias temperature (BT) by using a sorting pad 50 in the same manner as in typical tape carrier packages (TCP). The outer configuration and dimensions of the carrier film 30 are designed to meet the specifications determined by Electronic Industries Association of Japan (EIAJ). Such a design allows common use of sorting tools such as sockets and balls for various semiconductor devices.

Figure 2F:
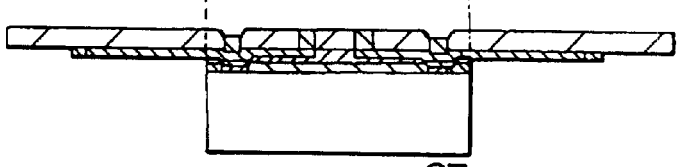
FIG. 2F PRIOR ART

In FIG. 2F, product names are labelled on the back surface of the chip by using a laser beam. The carrier film 30 is then cut along the edges of the chip assembly by using a mold. Typically, the cutting length and the width is larger by approximately 100 micrometers on each side than those of the chip assembly when a mold is used for cutting. More precise cutting may be achieved by using a dicing saw or a laser beam.

Figure 2G:
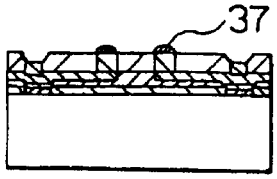
FIG. 2G PRIOR ART

Referring to FIG. 2G, bump electrodes (solder bumps) 37 are formed on corresponding outer chip electrodes 11 arranged as an array on the carrier film 30 at the second surface 31b thereof. The bump electrodes 37 may be formed by using a method disclosed in, for example, Japanese Patent Laid-open No. 49-52973. The bump electrodes 37 are formed by soldering a solder wire by using the wire bonding process on the surfaces of the semiconductor device corresponding to the chip electrodes 11 on the chip. The balls are then bonded to the pads, following which the wires are cut.

As mentioned above, this conventional manufacturing process is available only for the limited number of chips obtained per unit time because it is necessary to conduct the operations such as the inner lead bonding and the formation of the bumps for each small chip. Accordingly, there may be trouble in the interconnection between the semiconductor chip and the carrier film as well as the adhesion of the individual components. In addition, the bump electrodes in the above mentioned conventional semiconductor devices are formed on the corresponding chip electrodes, which causes some problems under the recent demands on the semiconductor chips towards the possible reduction in size with a higher terminal count and a smaller pitch.

Figure 3A:
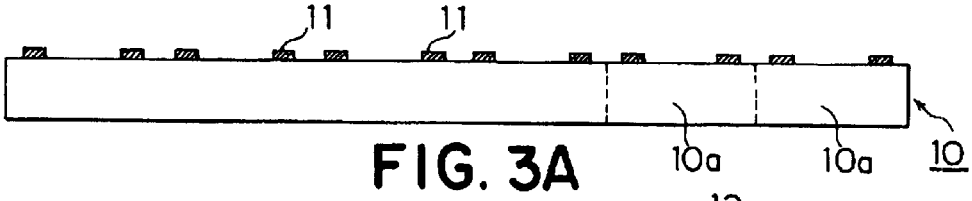
FIGS. 3A through 3G are cross-sectional flow diagrams showing a process for manufacturing a conventional semiconductor device.
Figure 3B:
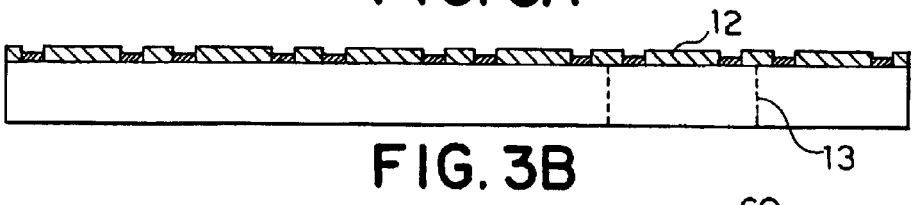

Next, an embodiment of the present invention is described with reference to FIGS. 3A through 3G and 4A through 4C. As shown in FIG. 3A, a number of semiconductor chip sections 10a are defined on a wafer 10 according to a well-known wafer manufacturing process. The chip section in this embodiment is square but may be rectangular for other applications. Each semiconductor chip section 10a has a number of chip electrodes (contact pads) 11 formed on one surface along the periphery thereof. Referring to FIG. 3B, the wafer 10 is covered with a passivating film 12 having a thickness of 20 micrometers or smaller. The passivating film 12 may be formed by means of any one of a plurality of adequate methods such as spin coating. In this event, the passivating film 12 covers the entire surface of the wafer 10 including the chip sections defined by scribe lines 13 with the chip electrodes 11 thereon. The wafer 10 is then subjected to well-known exposure and etching to expose the chip electrodes 11 to the atmosphere. This is clearly shown in FIG. 3B. The wafer 10 at this stage is similar to the wafer 10' illustrated in FIG. 1C. As mentioned above, the conventional manufacturing process then divides the wafer into the semiconductor chips along the scribe line 13. On the contrary, no dicing is made at this stage in the present invention.

Figure 3C:
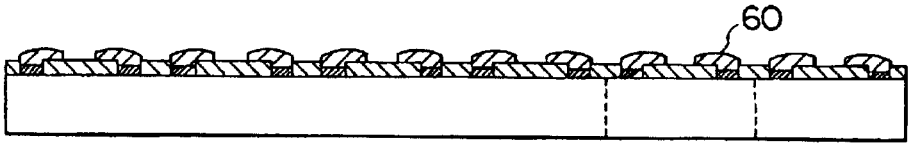
Figure 3D:
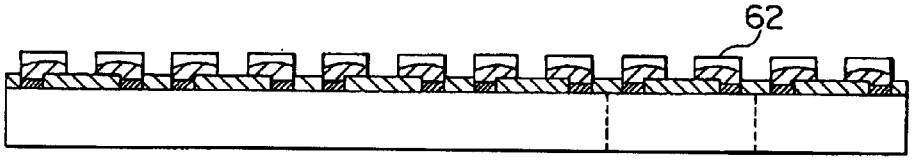

Referring to FIG. 3C, aluminum interconnection layers 60 are formed on the wafer 10. The aluminum interconnection layer 60 has a thickness of 1 micrometer or smaller and is connected to the chip electrode 11 at one end thereof. The other end of the aluminum interconnection layer 60 is extended inwardly of the chip section 10a. In other words, the aluminum interconnection layer 60 is extended towards the central portion of the chip section 10a. The aluminum interconnection layer 60 may be formed by means of a thin-film deposition technique such as sputtering using a mask. Referring to FIG. 3D, a nickel plating 62 is made on the aluminum interconnection layer 60. The nickel plating has a thickness of at least about 5 micrometers in order to absorb any thermal stress generated due to the difference in coefficient of thermal expansion between the final semiconductor device and a circuit board on which the semiconductor device is to be mounted. The thickness of the nickel plating 62 also affects the reliability of the joint between the nickel surface and a bump electrode formed later. In this embodiment, the nickel plating has a thickness of 10 micrometers. The plating on the aluminum interconnection layer 60 is not limited to nickel, and other metals such as copper may be used, provided that they have the desired adhesion and diffusion barrier properties, as a barrier metal, the material of the bump electrodes (solder in this embodiment).

Figure 3E:
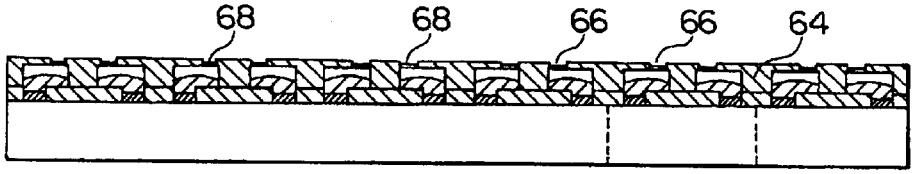

Referring to FIG. 3E, a cover coating film 64 is applied on the nickel plating 62 and the passivating film 12. The cover coating film 64 may be made of, for example, polyimide applied to have a thickness of 20 micrometers or smaller. This cover coating film 64 is similar in function to the organic insulation film 31 of the carrier film 30 described in conjunction with the conventional process. Next, a number of apertures 66 are formed in the cover coating film 64. The position of the apertures 66 corresponds to where the bump electrodes described below are formed. Accordingly, the position of the apertures 66 is not limited to a specific embodiment and may be selected depending on applications of the resultant semiconductor device. The aperture 66 is formed by means of, for example, etching (mechanical or laser) to the extent that the surface of the nickel plating 62 is exposed to the atmosphere. Subsequently, a gold plating 68 is made on the exposed surface of the nickel plating 62. Though not necessarily formed, the gold plating 68 is preferable for a higher reliability of the bump electrodes.

Figure 3F:
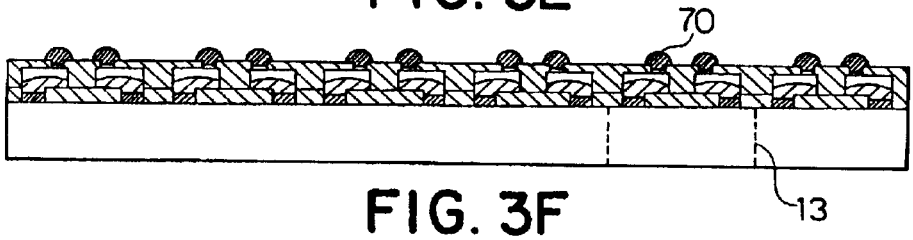

Referring to FIG. 3F, bump electrodes 70 are formed in the aperture 68 and on the surface of the cover coating film 68. The bump electrode 70 may be generally spherical or hemispherical and about 100 micrometers high, but different shapes may be used. This bump electrode 70 may be made according to the following steps. A solder piece is cut from a solder strip by using a die and a punch. This solder piece is adhered in the aperture 66 using an adhesive material such as rosin (flux). The solder piece is then heated and melted to form the bump electrode. The rosin is washed out after the formation of the bump electrodes 70.

Figure 4A:
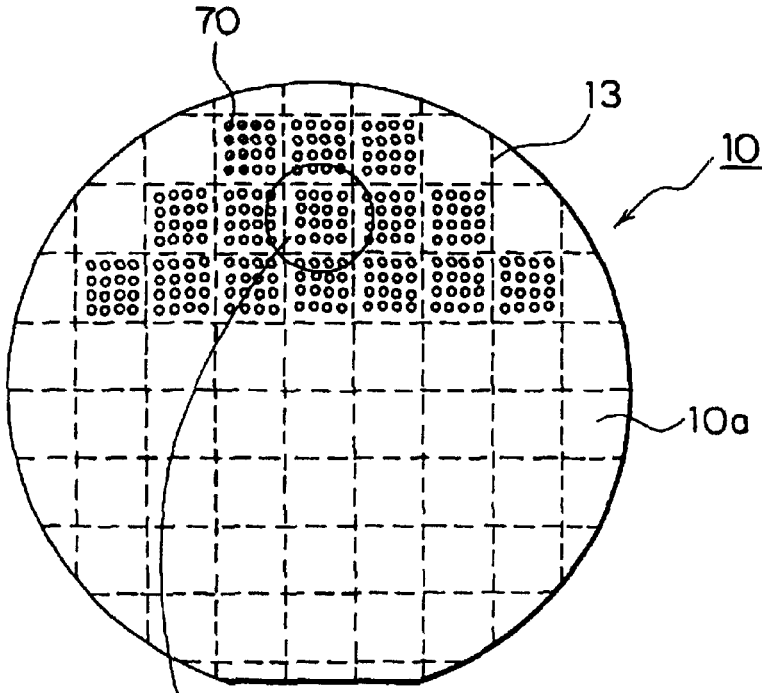
FIG. 4A is a schematic plan view of a wafer having a number of chip sections according to a process for manufacturing a semiconductor device of the present invention.
Figure 4B:
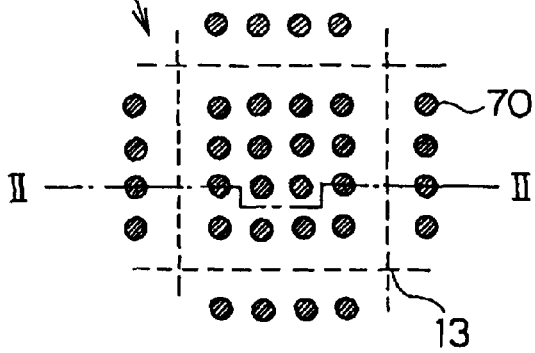
FIG. 4B is an elongated view of a chip section in FIG. 4A.
Figure 4C:
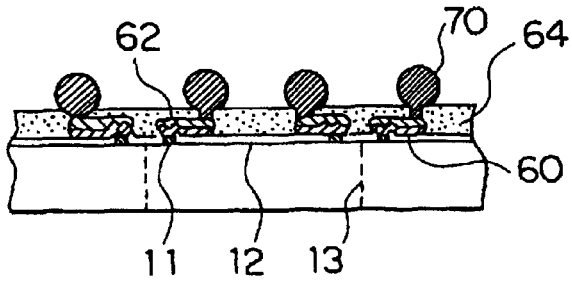
FIG. 4C is a cross-sectional view of the chip section taken on line II—II in FIG. 4B.

The wafer at this stage is illustrated in FIGS. 4A through 4C. As apparent from the figures, the bump electrodes 70 are formed on the entire surface of the wafer 10 except for there the scribe lines are defined. In addition, the aluminum interconnection layer 60 is extending at the position of the aperture 66. Though the bump electrodes 70 in this embodiment are formed on the wafer except for the portions just under which the chip electrodes 11 are formed, the bumps 70 may be formed over the chip electrodes 11.

Figure 3G:
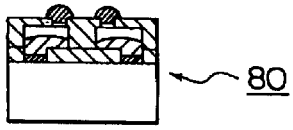

Turning to FIG. 3G, the semiconductor chip sections defined on the wafer 10 are separated from each other into individual semiconductor devices 80 by means of dicing.

The conventional wafer 10' illustrated in FIG. 1A has the chip electrodes 11 away from each other at a pitch of approximately 0.1 mm. The resultant semiconductor device thus has the bump electrodes away from each other at the same pitch of 0.1 mm or smaller. On the contrary, the pitch can be increased up to approximately 0.5 mm between the bump electrodes 70 on the semiconductor device 80 of this embodiment. Accordingly, the fusion or melting of the adjacent bumps can be reduced significantly which otherwise may occur during the formation of the bump electrodes. In addition, the semiconductor device according to the present invention can be mounted on, for example, a circuit board with a higher yield. Furthermore, the present process provides easier standardization of the semiconductor devices. This process also provides a higher reliability of the joint between the bump electrodes and the nickel or gold plating.

As mentioned above, according to the present invention, it is possible to mass-produce semiconductor devices without making a large investment for manufacturing facilities because the present process is in-line with a well-known chip manufacturing process. The semiconductor device obtained according to the present invention has a superior thermal stress resistance and good joints between the adjacent layers. This improves the moisture resistance of the semiconductor devices.

While the present invention has thus been described in conjunction with a specific embodiment thereof, it is understood that the present invention is not limited to the illustrated embodiment. Instead, any changes, modifications, and variations may be made by those skilled in the art without departing from the scope and spirit of the appended claims. For example, gold may be used for the bumps rather than the solder. In such a case, the nickel plating and the gold plating can be eliminated.

What is claimed is:

[1. A semiconductor wafer, including:

a plurality of the sections defined thereon by scribe lines, each chip section having bump electrodes formed simultaneously thereon, the scribe lines for separating the chip sections from each other without dividing bump electrodes thereon, said chip section including:

a plurality of chip electrodes positioned on said chip section; and a plurality of interconnection layers for electrically connecting said chip electrodes and said bump electrodes, said bump electrodes being located at positions other than over said chip electrodes, said chip section having a center and a periphery and said interconnection layers extend from said periphery toward said center.]

[2. A semiconductor wafer, including:

a plurality of chip sections defined thereon by scribe lines, each chip section having bump electrodes formed simultaneously thereon;

a plurality of chip electrodes positioned on said chip section; and a plurality of interconnection layers for electrically connecting said chip electrodes and said bump electrodes, said bump electrodes being located at positions other than over said chip electrodes, said chip section having a center and a periphery and said interconnection layers extend from said periphery toward said center.]

3. A semiconductor wafer including:

a plurality of chip sections defined thereon by scribe lines, each chip section having bump electrodes formed simultaneously thereon, the scribe lines for separating the chip sections from each other without dividing bump electrodes thereon, said chip section including:

a plurality of chip electrodes positioned on said chip section; and a plurality of interconnection layers for electrically connecting said chip electrodes and said bump electrodes, said bump electrodes being located at positions other than over said chip electrodes, wherein each of said interconnection layers comprises an aluminum layer and a plating on said aluminum layer, wherein *said aluminum layer and said plating extend from one of said bump electrodes to one of said chip electrodes and* said plating contacts *said* one of said bump electrodes and said aluminum layer contacts *said* one of said chip electrodes.

4. A semiconductor wafer including:

a plurality of chip sections defined thereon by scribe lines, each chip section having:

bump electrodes formed simultaneously thereon;

a plurality of chip electrodes positioned on said chip section; and a plurality of interconnection layers for electrically connecting said chip electrodes and said bump electrodes, said bump electrodes being located at positions other than over said chip electrodes, wherein each of said interconnection layers comprises an aluminum layer and a plating on said aluminum, wherein *said aluminum layer and said plating extends from one said bump electrodes to one of said chip electrodes and* said plating contacts said *one of said* bump electrode*s* and said aluminum layer contacts said *one of said* chip electrode*s*.

5. A semiconductor wafer as in claim 3, wherein said plating [compromises] *comprises* one of nickel and copper.

6. A semiconductor wafer as in claim 3, wherein said aluminum layer has a thickness of no greater than 1 micrometer.

7. A semiconductor wafer as in claim 3, wherein said plating has a thickness of at least 5 micrometers.

8. A semiconductor wafer as in claim 3, further comprising a gold layer between said bump electrode and said plating.

9. A semiconductor wafer as in claim [1] *4*, wherein each of said chip sections has a center and a periphery and said interconnection layers extend from said periphery toward said center.

10. A semiconductor wafer as in claim 4, wherein said plating comprises one of nickel and copper.

11. A semiconductor wafer as in claim 4, wherein said aluminum layer has a thickness of no greater than 1 micrometer.

12. A semiconductor wafer as in claim 4, wherein said plating has a thickness of at least 5 micrometers.

*13. The semiconductor wafer of claim 3, wherein each chip section has a center and a periphery and said interconnection layers extend from said periphery toward said center, and wherein the plurality of chip electrodes are positioned on said periphery.*

*14. The semiconductor wafer of claim 4, wherein each chip section has a center and a periphery and said interconnection layers extend from said periphery toward said center, and wherein the plurality of chip electrodes are positioned on said periphery.*

*15. A semiconductor wafer, including:*

*a plurality of the sections defined thereon by scribe lines, each chip section having bump electrodes formed simultaneously thereon, the scribe lines for separating the chip sections from each other without dividing bump electrodes thereon, said chip section including:*

*a plurality of chip electrodes positioned on said chip section; and*

*a plurality of interconnection layers for electrically connecting said chip electrodes and said bump electrodes,*

*said bump electrodes being located at positions other than over said chip electrodes,*

*said chip section having a center and a periphery and said interconnection layers extend from said periphery toward said center,*

*wherein said bump electrodes are arranged in a grid array.*

*16. A semiconductor wafer, including:*

*a plurality of chip sections defined theron by scribe lines, each chip section having:*

*bump electrodes formed simultaneously theron; a plurality of chip electrodes positioned on said chip section; and*

*a plurality of interconnection layers for electrically connecting said chip electrodes and said bump electrodes,*

*said bump electrodes being located at positions other than over said chip electrodes,*

*said chip section having a center and a periphery and said interconnection layers extend from said periphery toward said center,*

*wherein said bump electrodes are arranged in a grid array.*

*17. The semiconductor wafer of claim 3, wherein said bump electrodes are arranged in a grid array.*

*18. The semiconductor wafer of claim 4, wherein said bump electrodes are arranged in a grid array.*

*19. A semiconductor wafer, including:*

*a plurality of the sections defined thereon by scribe lines, each chip section having bump electrodes formed simultaneously thereon, the scribe lines for separating the chip sections from each other without dividing bump electrodes thereon, said chip section including:*

*a plurality of chip electrodes positioned on said chip section; and*

*a plurality of interconnection layers for electrically connecting said chip electrodes and said bump electrodes,*

*said bump electrodes being located at positions other than over said chip electrodes,*

*said chip section having a center and a periphery and said interconnection layers extend from said periphery toward said center,*

*wherein a pitch of said chip electrodes is different from a pitch of said bump electrodes.*

*20. A semiconductor wafer, including:*

*a plurality of chip sections defined theron by scribe lines, each chip section having:*

*bump electrodes formed simultaneously theron; a plurality of chip electrodes positioned on said chip section; and*

*a plurality of interconnection layers for electrically connecting said chip electrodes and said bump electrodes,*

*said bump electrodes being located at positions other than over said chip electrodes,*

*said chip section having a center and a periphery and said interconnection layers extend from said periphery toward said center,*

*wherein a pitch of said chip electrodes is different from a pitch of said bump electrodes.*

*21. The semiconductor wafer of claim 3, wherein a pitch of said chip electrodes is different from a pitch of said bump electrodes.*

*22. The semiconductor wafer of claim 4, wherein a pitch of said chip electrodes is different from a pitch of said bump electrodes.*

* * * * *

UNITED STATES PATENT AND TRADEMARK OFFICE

CERTIFICATE OF CORRECTION

PATENT NO. : RE 39,603 E
APPLICATION NO. : 10/645782
DATED : May 1, 2007
INVENTOR(S) : Keiichiro Kata and Shinichi Chikaki It is certified that error appears in the above-identified patent and that said Letters Patent is hereby corrected as shown below:

Title page, item [73] Assignee should read --NEC Electronics Corporation, Kanagawa (JP)-- instead of "NEC Corporation, Tokyo (JP)"

Signed and Sealed this

Twenty-sixth Day of August, 2008

JON W. DUDAS
*Director of the United States Patent and Trademark Office*